United States Patent
Böhm

(10) Patent No.: US 7,977,957 B2
(45) Date of Patent: Jul. 12, 2011

(54) METHOD AND APPARATUS FOR ELECTRICAL TESTING OF A UNIT UNDER TEST, AS WELL AS A METHOD FOR PRODUCTION OF A CONTACT-MAKING APPARATUS WHICH IS USED FOR TESTING

(75) Inventor: Gunther Böhm, Nufringen (DE)

(73) Assignee: Feinmetall GmbH (DE)

( * ) Notice: Subject to any disclaimer, the term of this patent is extended or adjusted under 35 U.S.C. 154(b) by 165 days.

(21) Appl. No.: 11/479,659

(22) Filed: Jun. 29, 2006

(65) Prior Publication Data

US 2007/0001707 A1    Jan. 4, 2007

(30) Foreign Application Priority Data

Jun. 30, 2005 (DE) .................... 10 2005 030 496
Jun. 16, 2006 (DE) .................... 10 2006 028 141

(51) Int. Cl.
G01R 31/308 (2006.01)
G01R 31/00 (2006.01)
(52) U.S. Cl. ............... 324/750.23; 324/750.16
(58) Field of Classification Search .......... None
See application file for complete search history.

(56) References Cited

U.S. PATENT DOCUMENTS

| | | | | |
|---|---|---|---|---|
| 5,410,259 A | * | 4/1995 | Fujihara et al. | 324/758 |
| 5,422,579 A | * | 6/1995 | Yamaguchi | 324/758 |
| 5,517,126 A | * | 5/1996 | Yamaguchi | 324/758 |
| 5,521,522 A | * | 5/1996 | Abe et al. | 324/758 |
| 5,525,911 A | * | 6/1996 | Marumo et al. | 324/754 |
| 6,078,186 A | * | 6/2000 | Hembree et al. | 324/755 |
| 6,356,090 B2 | * | 3/2002 | Deshayes | 324/754 |
| 6,429,671 B1 | | 8/2002 | Duckworth et al. | 324/758 |
| 6,871,307 B2 | * | 3/2005 | Nachumovsky | 714/718 |
| 7,015,711 B2 | * | 3/2006 | Rothaug et al. | 324/758 |
| 2004/0201392 A1 | | 10/2004 | Kim et al. | 324/758 |
| 2006/0132155 A1 | * | 6/2006 | Yamada et al. | 324/754 |

* cited by examiner

*Primary Examiner* — Paresh Patel
(74) *Attorney, Agent, or Firm* — Ostrolenk Faber LLP

(57) ABSTRACT

A contact-making apparatus for electrical connection of a unit under test to an electrical test device, having a plurality of electrical contacts which are associated with at least one holding element. The contact-making apparatus and preferably the holding element thereof, is provided with at least one marking which is in a defined position with respect to at least one of the contacts. The marking is detected for alignment of the apparatus and the unit. A corresponding method of use and a method of manufacture are also disclosed.

27 Claims, 2 Drawing Sheets

METHOD AND APPARATUS FOR ELECTRICAL TESTING OF A UNIT UNDER TEST, AS WELL AS A METHOD FOR PRODUCTION OF A CONTACT-MAKING APPARATUS WHICH IS USED FOR TESTING

BACKGROUND OF THE INVENTION

The invention relates to a method for electrical testing of a unit under test, which is connected via a contact-making apparatus to an electrical test device. The contact-making apparatus has a plurality of electrical contacts on at least one holding element for making contact with mating contacts on the unit under test. The contacts and the mating contacts are positioned with respect to one another with the assistance of optical detection processes of the contact-making apparatus and the unit under test.

In order to carry out an electrical function test on an electrical unit under test, for example a wafer, this unit is connected to an electrical test device by means of a contact-making apparatus. The contact-making apparatus has electrical contacts on at least one holding element, in order to make contact with mating contacts on the unit under test. The contacts and mating contacts are aligned relative to one another with the aid of an optical device. Contact is then made, that is, the mating contacts on the unit under test make touching contact with the contacts on the contact-making apparatus. The electrical test device is thus connected to the unit under test, so that continuity measurements, isolation measurements etc. can be carried out. The optical device, which is preferably in the form of a camera, is not used to detect all of the contacts on the contact-making apparatus, in order to speed up the test process. The detection process is carried out in particular only at significant points, for example by detection of corner contacts. This results in a risk of an incorrect position being calculated for making contact when, for example, a plurality of identical or similar contact patterns occur in the contact-making apparatus.

Furthermore, a contact-making apparatus is known having electrical contacts that are pressed against mating contacts on the unit under test in order to test such a unit. The contact-making apparatus is connected to an electrical test device, so that the unit under test can be electrically tested via the current paths that have been created. For example, wafers for the manufacture of semiconductor chips can be tested in this way. In order to allow a good contact to be made between the unit under test contacts which form the mating contacts and the contacts on the contact-making device, it is known for the position of the contacts of the contact-making apparatus and the position of the mating contacts of the unit under test to be detected by means of a camera, or a camera system, and to be made to coincide, that is, be aligned by appropriate movement of the contact-making apparatus and/or of the unit under test. In order to speed this process, the camera does not detect all of the contacts of the contact-making apparatus, but only detects significant points, such as corner contacts, that is, contacts which are located at the corner points of the contact arrangement. In the case of multiple probing, that is a test in which, for example, a plurality of IC chips on a wafer are tested at the same time, there is a risk that an incorrect position will be calculated for making contact, since there are a plurality of identical or similar contact patterns in the contact-making apparatus and/or the unit under test. There is also a risk the alignment process may take a very long time, or may even have to be carried out manually.

SUMMARY OF THE INVENTION

The invention is thus based on the object of creating a method for electrical testing of a unit under test, of the type mentioned in the introduction, in which the contacts on the contact-making apparatus can be aligned with the mating contacts on the unit under test very quickly and precisely, and without errors.

According to the invention, this object is achieved in that at least one marking on the contact-making apparatus, which is in a defined position with respect to at least one of the contacts, is detected optically for position determination. Because of the marking, it is no longer necessary to reliably identify specific contacts in the contact-making apparatus, with these having to be the "correct" contacts, because the detection of the marking in relation to the mating contacts on the unit under test allows the relative positions of the contacts and mating contacts to be determined correctly. This allows error-free contact to be made between contacts and mating contacts, and thus allows the unit under test to be tested quickly. In particular, a plurality of markings may be provided on the contact-making apparatus, which are to be detected optically. In consequence, a marking is not a contact or a specific contact arrangement, but is a separate identification which is in a defined position with respect to at least one of the contacts, and preferably with respect to a plurality of the contacts. When the optical device determines the at least one marking, corresponding data can be supplied to an evaluation device. This knows the relative position of the marking with respect to the contacts or at least with respect to one of the contacts, and is thus able to determine the relative position between the contacts and the unit under test, in particular its mating contacts. The unit under test, in particular the mating contacts on the unit under test, is or are detected by means of the same optical device or by means of another optical device, which likewise supplies its data to the evaluation device. The only process still necessary in order to make contact is to align the unit under test relative to the contacts, and then to make contact.

One development of the invention provides for at least one marking on the holding element to be detected optically as a marking, that is, the marking is located on the holding element.

It is also advantageous for the unit under test to be positioned or moved relative to the fixed-position contact-making apparatus for alignment of the contact-making apparatus and unit under test. The unit under test can accordingly be moved, for example in the X and Y directions, with the contact between the contacts and the mating contacts being made in the Z direction. Angular alignment (the angle theta) is preferably also possible on the X-Y plane. This means that the unit under test can be pivoted on the X-Y plane.

According to one development of the invention, the at least one marking is preferably arranged to the side of the contacts.

In order to fix the unit under test during the test, it is preferably held on a movable chuck, preferably by vacuum pressure. The unit under test may be an electrical or electronic device, for example a wafer, which is provided with a large number of chips, which have to be tested.

The contact-making apparatus is preferably in the form of a probe card.

As already indicated, a plurality of markings, for example at least two markings, may be provided on the contact-making apparatus, and the markings are detected optically.

In particular, provision is made for the at least two markings to be arranged with respect to one another in such a manner that they are at the same distance, or at approximately the same distance, away from a center of the arrangement of the contacts. This center is an imaginary center which would lie approximately in the center of the surface in which the electrical contacts are located, in a plan view of the contact distribution of the electrical contacts. If the two markings are now located the same distance away from the center, or are located approximately the same distance away from it, then a pivoting movement about the center, for example in the magnitude of an angle theta, makes it possible to carry out an optimal angle correction. This is particularly important in the case of an asymmetric contact arrangement, since contact arrangements such as these can frequently lead to problems, because the evaluation apparatus always starts from a pure theta rotation during the alignment process, which is carried out automatically. If rotation were to take place about a center which is not located approximately at the imaginary center of the contact arrangement in a specific pattern, then an angular rotation would at the same time lead to a very different offset of the individual contacts in the X and Y directions, that is only a sub-optimum correction would be carried out. If, however, the pivoting point or rotation point were to be located approximately at the center of the "contact pattern", then an angle correction can be carried out in a very simple manner.

One development of the invention provides that the unit under test is initially aligned with respect to the optically detected position of the at least one marking with the assistance of its optical detection, with respect to a virtual coordinate system (coarse alignment). The optical detection of the unit under test preferably includes the detection of its mating contacts. The relative position of the contacts of the contact-making apparatus with respect to the mating contacts is determined by optical detection of the at least one marking.

Furthermore, it is advantageous that the initial alignment is followed by fine alignment of the unit under test relative to the contact-making apparatus, in particular with respect to its contacts. The at least one marking on the contact-making apparatus is optically detected for fine alignment. As already mentioned, the initial alignment and/or the fine alignment are/is carried out by comparison of the optically detected results from the at least one marking and from the unit under test. The fine alignment is followed by the contacts making contact with the unit under test in a test position. Further test positions may be assumed for the testing of the same unit under test, although this is done without another optical comparison according to the above embodiments, but on the basis of geometric presets. This means that, when a plurality of electronic circuits, for example chips, are arranged on a wafer, their relative position is known on the basis of geometric presets. It is then possible to approach each of the electronic circuits/ICs/chips etc. by appropriate movement of the chuck during the test.

All of the above statements relate to an automatic process, that is, the alignment of and making contact with the unit under test by means of the contacts of the contact-making apparatus are carried out completely automatically.

Furthermore, it is advantageous for at least one marking to be in the form of a multiple marking, in particular a double marking, with at least one coarse structure and at least one fine structure. The positioning or alignment is carried out on the basis of the coarse structure by means of optical, low-resolution detection of the coarse structure, and then on the basis of the fine structure by means of optical, high-resolution detection of the fine structure. This achieves high accuracy in a short time.

In particular, the invention provides for the fine structure to be arranged within the coarse structure, that is, the marking center of the coarse structure and the fine structure coincide. In particular, the coarse structure is detected with low optical resolution, and the fine structure then is detected with higher resolution in order to determine the relative positions of contacts and mating contacts for fine alignment.

The invention also relates to an apparatus, particularly for carrying out the above-mentioned method. It has a contact-making device for electrical connection of a unit under test to an electrical test device. The contact making device has a plurality of electrical contacts, which are associated with at least one holding element, for making contact with mating contacts on a unit under test. The contact-making apparatus, preferably the holding element, is provided with at least one marking which is in a defined position with respect to at least one of the contacts. At least one optical device which detects the marking and the unit under test, in particular the electrical mating contacts on the unit under test. The marking ensures that the position of the contact-making apparatus is identified correctly by the at least one optical device, which is in particular a camera or a camera system. In that case the positions of the contacts are also known, since the marking has a fixed, known reference to the contacts. In consequence, the invention makes it possible to determine the position of the contact-making apparatus and thus the position of the contacts relative to the unit under test very quickly and on a one-to-one basis, so that no errors or incorrect positions occur in the subsequent testing, even in the case of multiple probing. Furthermore, the alignment process is speeded up to a very major extent, since the marking according to the invention can be determined very quickly and reproducibly.

It is also advantageous for at least one positioning apparatus to be provided for automatic alignment of contacts and mating contacts relative to one another, taking into account the optical detection.

The at least one marking preferably has a coarse structure and a fine structure. The coarse structure and the fine structure preferably have the same marking center.

It is advantageous for the marking which is arranged on the holding element to be designed to have optical contrast with respect to the holding element. The optical contrast improves the detection by the optical device.

One development of the invention provides for the marking which is arranged on the holding element to have optical contrast with respect to the holding element. The contrast between the holding element and the marking results in the latter being identified quickly and unambiguously by the camera or the camera system.

It is also advantageous for the marking to be arranged on the side of the holding element associated with the unit under test. This makes it possible to determine both the position of the unit under test with respect to its mating contacts and that of the marking and thus of the electrical contacts in particular using only one camera, as is possible, for example, by means of a semi-transparent mirror associated with the camera, which allows detection in directions at 180° with respect to one another.

It is also advantageous for the holding element to have apertures in which the contacts are guided in an arranged manner, preferably such that they can move, particularly vertically.

In particular, the contacts may be in the form of bent wires.

The invention also relates to a method for production of a contact-making apparatus, for electrical connection of a unit under test to an electrical test device, having a plurality of electrical contacts which are associated with apertures in at least one holding element. The contact-making apparatus, in particular the holding element, is provided with at least one marking which is in a defined position with respect to at least one of the contacts. The marking may be produced using the same machining apparatus and/or the same type of machining which also produces the apertures. The use of the same machining apparatus and/or the same type of machining ensures that a defined position of the marking exists relative to one contact or to a plurality of contacts. This produces a reproducible, known distance, even when seen in three dimensions.

It is also advantageous for the apertures and the marking to be formed using the same setting. This means that there is no rejigging of the contact-making apparatus (or of a component of it) during the production of the apertures and the marking, with them being held at the same setting, thus avoiding positioning errors and/or tolerance errors.

In particular, laser machining and/or mechanical machining are/is carried out as the type of machining.

It is advantageous for the marking to be produced as a multiple marking, in particular as a double marking, and for the individual markings in the multiple marking (marking elements of the multiple markings) to be produced using the same machining apparatus and/or type of machining and/or the same setting. This results in a highly precise relative position between the coarse marking and the fine marking, and between the individual markings of the multiple marking. In particular, the invention provides for all of the markings in the multiple markings to have the same marking center. The expression "setting" should be understood as meaning that the corresponding workpiece must be attached, that is set, with respect to the marking during the machining. If this setting is retained when the plurality of marking elements are being produced (for example coarse marking and fine marking), that is the workpiece is not unclamped in the meantime, then high precision is achieved.

As already mentioned, one development of the invention provides for the marking to be in the form of a multiple marking, in particular a double marking, with a coarse structure and a fine structure. In the case of a marking in the form of a reticle, for example, this should be understood as meaning a coarse cross with a correspondingly thick line thickness. A fine structure is located within this coarse structure, and is likewise in the form of a reticle, but with a very fine line thickness. The two crosses have a common crossing point.

During alignment of the contacts and mating contacts with respect to one another, an optical device with an appropriately low resolution first detects the coarse structure, that is the cross with the thick line thickness, and a coarse alignment is carried out. Once this has been done, the optical resolution of the optical system, in particular of the camera, is increased in the course of the overall alignment process, so that the fine structure can be detected, allowing fine alignment. After completion of the fine alignment, the contacts and mating contacts are aligned exactly with respect to one another.

Other features and advantages of the present invention will become apparent from the following description of the invention which refers to the accompanying drawings.

DESCRIPTION OF A PREFERRED EMBODIMENT OF THE INVENTION

Figure 1:
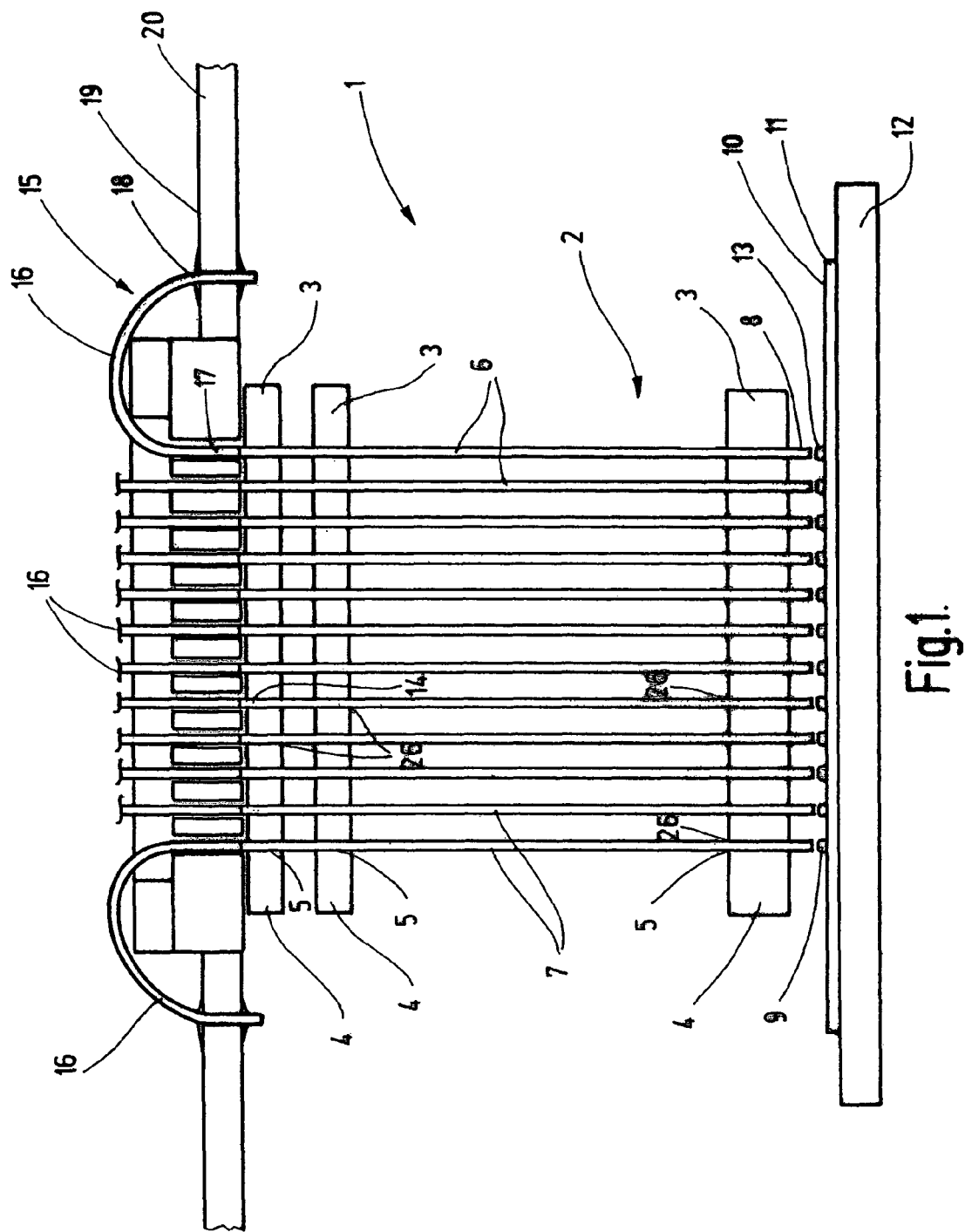
FIG. 1 is a schematic side view of a contact-making apparatus.

FIG. 1 shows a contact-making apparatus 1 which has a contact head 2 with holding elements 3 in the form of guide plates 4. Apertures 26, in particular guide holes 5, pass through the guide plates 4, with contacts 7 in the form of bent wires 6 arranged in them. The lower ends 8 of the contacts 7 in FIG. 1 are used to make a touching contact with contacts 9 on a unit under test 10 which, for example, may be in the form of a wafer 11 and which may be supported on a chuck 12. The contacts 9 on the unit under test 10 accordingly form mating contacts 13 for the contacts 7. The ends 14 of the contacts 7, which are opposite the ends 8, interact with a conversion device 15, which has contact wires 16 arranged in a corresponding manner to the pattern of the contacts 7. The ends 17 of the contact wires 16 make touching contact with the ends 14 of the contacts 7, and the other ends 18 of the contact wires 16 are soldered to conductor tracks 19 on a printed circuit board 20. The conductor tracks 19 on the printed circuit board 20 lead to an electrical test device, or the printed circuit board 20 is a component of the electrical test device.

A procedure for electrical testing of the unit under test 10 is as follows. The ends 8 of the contacts 7 meet the mating contacts 13 on the unit under test 10 by relative movement of the contact-making apparatus 1 and of the unit under test 10 (together with the chuck 12) with respect to one another. The electrical test device (which is not illustrated) can now test whether the unit under test is electrically sound. For this purpose, appropriate test currents or the like are passed to the unit under test 10 via the conductor tracks 19 on the printed circuit board 20, the contact wires 16, the contacts 7 and the mating contacts 13. As is evident from the above description, it is necessary in order to make a good contact with the unit under test 10 for the ends 8 of the contacts 7 to be aligned precisely with the mating contacts 13 on the unit under test 10.

Before making contact with the unit under test 10, it is therefore necessary to align the contact-making apparatus 1 in the X and Y directions before contact is made in the Z direction. A camera 21 (FIG. 3) is used for this purpose and can carry out a detection process in two mutually opposite directions. A cone 22, which is shown by dashed lines, indicates the viewing direction of the camera from underneath the test head 2, and a cone 23 illustrates the viewing direction of the camera 21 downwards onto the unit under test 10. The double-headed arrow 24 indicates the insertion of the camera 21 between the assemblies that have been mentioned, and its removal from the space between the assemblies.

Figure 2:
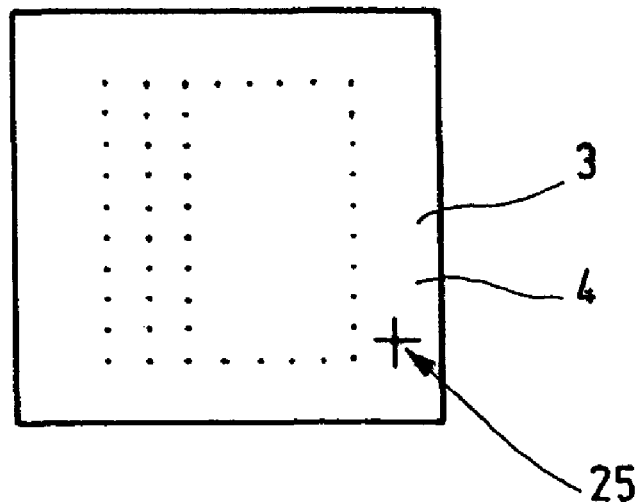
FIG. 2 is a view from underneath of the test head of the contact-making apparatus shown in FIG. 1.
Figure 3:
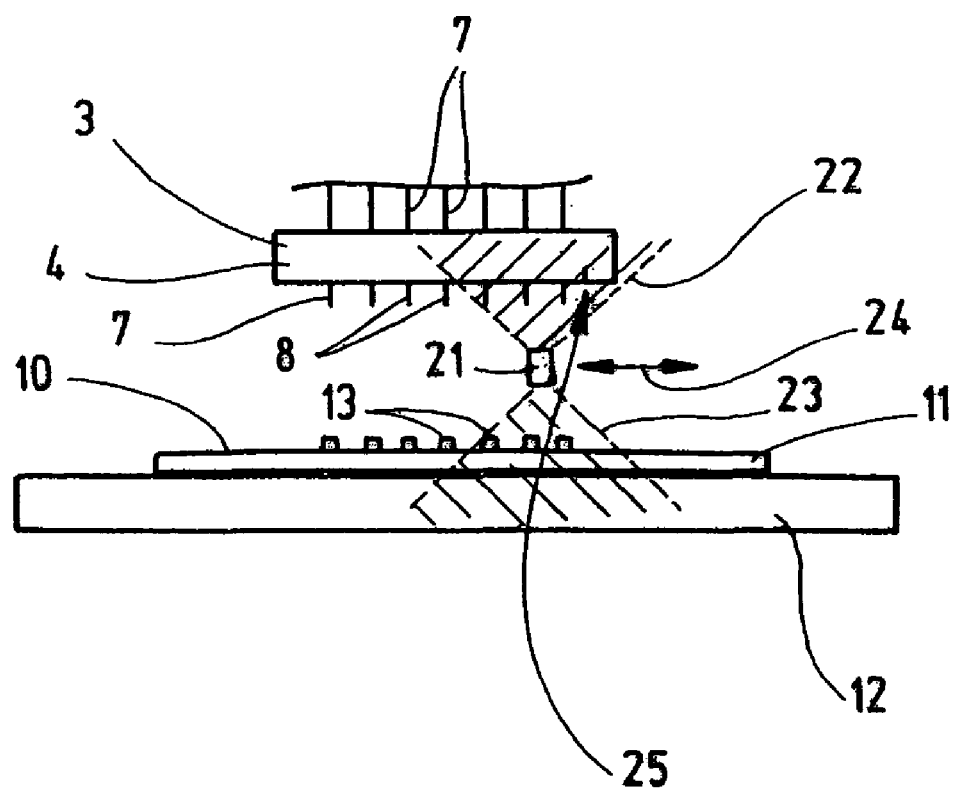
FIG. 3 is a camera which is introduced between the contact-making apparatus and the unit under test, for detection of the position and for carrying out an alignment before a test process.

In order now to make it possible to determine the position of each of the contacts 7 on the test head 2 by means of the camera 21, provision is made, as shown in FIGS. 2 and 3, for application of at least one marking 25, and preferably of two markings 25 at a distance from one another, on the holding element 3, in particular on the guide plate 4 which is adjacent to the unit under test 10. The marking or markings is or are in a defined position with respect to at least one contact 7, preferably with respect to a plurality of contacts 7, and in particular with respect to the ends 8 of the contacts 7. The at least one marking 25 is detected by the camera 21. Since the association between the at least one marking on the contacts 7 is fixed and is stored in a data processing program, the position of the contacts 7 can be detected very quickly and easily by means of an automatically operating alignment system, with the contact-making apparatus 1 being aligned relative to the unit under test 10 if necessary. Since the camera 21 also detects the mating contacts 13 on the unit under test 10, it is possible to determine any alignment errors between the contacts 7 and the mating contacts 13. The detection of the at least one marking 25 can be carried out very quickly by the camera 21 in the camera system without this leading to any errors such as those which can occur during multiple probing, when a plurality of IC chips are arranged on one wafer and are intended to be tested at the same time. There is then a risk of a prober (handling device for the wafer), which is not illustrated, calculating an incorrect position for making contact when there are a plurality of identical contact patterns on the test head, or there is a risk of this process lasting for a very long time or even having to be carried out manually. However, the above problems occur only when, as is known, the contacts 7 are detected by the camera itself. However, since the at least one marking 25 is used according to the invention for detection of the position of the contacts 7, with there being a fixed association, which is known to the overall system, between the marking 25 and at least one of the contacts 7, the position can be determined by means of the camera 21 without errors, quickly and without any problems, when this camera 21 detects/evaluates only the marking 25 and not the contacts 7.

It is, of course, possible to provide a plurality of markings 25, for example three markings 25. Furthermore, is it also feasible for the at least one marking 25 to be located at a different point than on the lower face of the lowermost guide plate 4. The only important factor is that the position of the contacts 7 can be detected quickly and without errors by the camera system by means of at least one marking, and that a rapid and error-free positioning can then be carried out automatically, in order subsequently to allow correct contact to be made with the unit under test 10. The camera system accordingly interacts with a data processing system and at least one handling device in order to allow alignment to be carried out in the X and Y directions, for alignment of the contacts 7 and mating contacts 13. Contact is then made with the unit under test 10 in the Z direction once the camera 21 has been moved out of the contact zone.

In order to allow the at least one marking 25 to be considerably more evident in comparison to the contact-making apparatus 1, and in particular the holding element 3, it is designed to have optical contrast with respect to the holding element 3. By way of example, a cross can be used as the marking, or other patterns which allow each of the positions to be determined.

It is preferably possible to provide for the at least one marking 25 to be applied to the contact-making apparatus 1 by laser machining. Additionally or alternatively, it is possible for the guide holes 5 for holding the contacts 7 likewise to be produced by laser machining. In this case, in particular, it is possible to provide for the guide holes 5 to be incorporated in the same process by means of the machining device, in particular the laser, in which the at least one marking 25 is also produced. Furthermore, during the machining mentioned above, it is preferably possible to form the guide holes 5 which form the apertures 26 and to produce the marking with the contact-making apparatus 1 in the same setting, that is, with this contact-making apparatus 1 being clamped in for the machining process and remaining in the clamped-in position, that is without being rejigged, in order to produce not only the apertures 26 but also the at least one marking 25. This procedure ensures that no unacceptable tolerances are created. The marking 25 is accordingly positioned with high precision relative to the apertures 26 and accordingly relative to the contacts 7. In order to maximize the contrast of the at least one marking 25, the background on which the marking 25 is located may be colored, for example in the form of a white area. The marking 25 is then introduced into this white area and appears in the form of dark lines because the guide plate 24 is preferably designed to be dark and accordingly appears through there in a dark form as a result of material (the white of the white area) having been removed in order to form the marking 25.

During the process of alignment of and making contact between a unit under test which has mating contacts and a contact-making apparatus which has electrical contacts, the procedure is particularly preferably as follows: the entire alignment process is carried out as an auto-alignment process, that is automatically. This also applies to the contact-making process. The automatic alignment of the unit under test, for example of the wafer, in the apparatus according to the invention is controlled by means of a camera system. This results in optimum alignment of the unit under test (for example a wafer) with respect to the contacts of the contact-making apparatus. The holding element, which is provided with contacts, for the contact-making apparatus may be in the form of a so-called probe card. The contacts are in the form of needles with very fine dimensions, which are inserted into guide holes in a plurality of guide plates or the like, which are part of the holding element.

The alignment process takes place as follows: the unit under test is loaded on the so-called chuck. An automatic loading device is provided for this purpose. The unit under test, in particular a wafer, is held firmly on the chuck by means of a vacuum. After this loading process, the unit under test, in particular a wafer, is aligned. This is done by the chuck moving it under the camera system. The camera system identifies the position of the unit under test. The unit under test is aligned by means of the chuck, which can be moved in the X and Y directions and can be rotated through an angle theta on this X-Y plane, with respect to a virtual X-Y-Z system. The chuck can accordingly also move in the Z direction. This is the direction in order to move the unit under test in the direction of the contacts on the contact-making apparatus. A second camera system or a second camera in the system that has been mentioned is pointed at that side of the contact-making apparatus which faces the unit under test, that is the probe card which is clamped in there is detected by this camera system. The camera system first searches with low optical resolution for at least one marking according to the invention, preferably two markings according to the invention. Since these markings are in a defined position with respect to the contacts and thus with respect to the needle points of the needles of the contacts of the contact arrangement (needle arrangement), the position of the needle points, that is to say of the contacts on the contact-making apparatus, can be detected precisely simply by detection of the at least one marking, and can now be processed further automatically in accordance with the recorded data. The problems from the prior art, in which the needle tips rather than a marking are detected, which is a problem because of the very fine structures and can lead to detection errors, accordingly do not occur with the invention. These problems which occur in the prior art occur in particular in the case of multiple probing, that is when a plurality of chips are being tested at the same time on one unit under test (wafer). The electrical structures thus occur more than once.

If confusion occurs, then the contacts, that is the needles, of the contact-making apparatus are, for example, incorrectly related to an adjacent chip, and not to the desired chip. This means that the contacts are placed incorrectly on the wafer when contact is made. This results in an offset, and thus in an incorrect association between the measurement results that are recorded during the testing of the unit under test, and the individual chips. The invention results in the contacts, that is to say the needle points, being at a precisely defined lateral distance from the at least one marking (alignment mark). The marking has appropriate contours to allow exact and reliable initial alignment.

In particular, the invention provides for the marking according to the invention or the markings to be designed such that they are suitable not only for initial alignment (detection of a coarse structure) but also for fine alignment (detection of a fine structure). It is thus possible to dispense entirely with the use of needle points for alignment, which is known from the prior art and is susceptible to errors. In the case of fine alignment, the corresponding camera system operates with a higher optical resolution than that used for the initial alignment, so that the alignment process can be carried out even more accurately after exact fine alignment and before the chuck moves the unit under test (wafer) in the Z direction, so that the contacts and mating contacts meet one another precisely, thus resulting in a good contact being made, without any errors.

In particular, the invention provides for at least two markings to be placed such that they are at the same distance away from a selected center of the X-Y system of the contact arrangement (needle arrangement), in order to allow exact X-Y-theta alignment. The unit under test must be pivoted about the "correct" center for theta alignment.

In the case of asymmetric or symmetrical needle arrangements, the center is located somewhat above the contour of the needle arrangement, seen at the "centroid". This is the optical "centroid". In particular in the case of asymmetric contact arrangements (needle arrangements) in the contact apparatus, it would otherwise be possible for a problem to occur since the contact-making apparatus always assumes a pure theta rotation in the case of a −X and/or −Y offset, or a +X and/or +Y offset when attempting to correct the Y offsets. In the case of an asymmetric needle arrangement, this would thus result in sub-optimal correction. The system according to the invention accordingly itself chooses a rotation point (center). The rotation point is assumed to be generally at the optical centroid of the needle arrangement. Since the rotation angle (theta angle) changes with the position of the rotation point, however, the procedure used for the invention is for the center (rotation point) to be located between two markings. Since the two markings are approximately the same distance away from the rotation point, a theta correction leads to optimum results.

The invention prevents an offset to the incorrect chip row on the unit under test, since the corresponding marking (alignment mark) according to the invention occurs only once in the focus of the camera in the camera system. The invention results in faster alignment, since the marking according to the invention or the markings according to the invention is or are found quickly by virtue of their contour size and is or are also reliably identified, furthermore allowing high-precision detection.

As already mentioned, after the initial alignment and the subsequent fine alignment, the test is then carried out, that is the test on the unit under test. This starts with the chip or chips defined via a data processing program in the control device or evaluation device. The individual test steps are then carried out "blindly" over the entire wafer, that is the process of making contact with the adjacent chips during the test, that is to say no further alignment is carried out by means of the camera system, since the corresponding chip associations are known to the program. No realignment process, as described above, is carried out until the next wafer is to be tested. The arrangement is always designed such that only the unit under test but not the contact-making apparatus is aligned.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. A method for electrical testing of a unit under test, wherein the unit is connected via a contact-making apparatus to an electrical test device, and the contact-making apparatus having a plurality of electrical contacts on at least one holding element for making contact with mating contacts on the unit under test, and with the contacts and the mating contacts being positioned with respect to one another with the assistance of optical detection processes of the contact-making apparatus and unit under test, the method comprising:
    clamping the holding element in a position,
    producing and placing at least one marking, which is a defined position with respect to at least one of the contacts, on the contact-making apparatus,
    producing apertures in the holding element and associating the plurality of electrical contacts with the apertures in at least one holding element, the marking and apertures being produced using at least one of a same machining apparatus and a same type of machining process with the apertures and marking being formed at the same time with the holding element remaining in the clamped-in position, and
    detecting the marking optically for position determination and positioning the contacts and the mating contacts with respect to one another with assistance of the optical detection of the contact-making apparatus and the unit under test.

2. The method according to claim 1, wherein the at least one marking on the holding element is detected optically as a marking.

3. The method according to claim 1, further comprising positioning or moving the unit under test relative to the fixed-position contact-making apparatus for alignment of the contact-making apparatus and the unit under test.

4. The method according to claim 1, wherein the at least one marking is arranged to the side of the contacts.

5. The method according to claim 1, further comprising holding the unit under test at or on a movable chuck.

6. The method according to claim 5, further comprising holding the unit under test at or on the chuck by vacuum pressure.

7. The method according to claim 5, further comprising moving at least one of the chuck and the unit under test in at least one of an X direction, a Y direction and with respect to a rotation angle ($\theta$=Theta) for the alignment.

8. The method according to claim 1, wherein a wafer is tested as the unit under test.

9. The method according to claim 1, wherein a probe card is used as the contact-making apparatus.

10. The method according to claim 1, further comprising placing at least two of the markings on the contact-making apparatus for being detected optically.

11. The method according to claim 10, wherein the at least two markings are arranged at approximately a same distance away from a center of the arrangement of the contacts.

12. The method according to claim 1, further comprising initially aligning the unit under test with respect to the optically detected position of the at least one marking with the assistance of the optical detection, using a virtual coordinate system.

13. The method according to claim 12, further comprising initial aligning the contacts of the unit under test and of the contact-making apparatus followed by finely aligning the unit under test relative to the contact-making apparatus and with respect to the contacts of the contact-making apparatus.

14. The method according to claim 13, wherein at least one marking on the contact-making apparatus is optically detected for the fine alignment.

15. The method according to claim 13, wherein at least one of the initial alignment and the fine alignment is carried out by comparison of optically detected results from the marking and from the unit under test.

16. The method according to claim 13, further comprising contacting the unit under test by means of the contact in a test position after the fine alignment.

17. The method according to claim 1, further comprising at least one additional test position being assumed for the testing of the same unit under test on the basis of geometric presets without another optical comparison.

18. The method according to claim 1, wherein the method is carried out automatically.

19. The method according to claim 1, wherein the at least one marking is in the form of a multiple marking including at least one coarse structure and at least one fine structure with the initial positioning for alignment on a basis of the coarse structure by means of optical, low-resolution detection of the coarse structure, and then positioning for alignment on a basis of the fine structure by means of optical, high-resolution detection of the fine structure.

20. The method according to claim 19, wherein the fine structure is arranged within the coarse structure.

21. The method according to claim 19, wherein the coarse structure and the fine structure are provided with a same marking center.

22. A method for electrical testing of a unit under test, comprising the steps of:

making an electrical connection of the unit under test to an electrical test device via a contact-making apparatus, the contact-making apparatus having a holding element for holding a plurality of electrical contacts, clamping the holding element in a position, providing the holding element with apertures with which the plurality of electrical contacts are associated, marking the holding element of the contact-making apparatus with at least one marking which is in a defined position with respect to at least one of the contacts, producing the marking and apertures using at least one of a same production apparatus and a same type of production process to produce the marking which also produces the apertures with the apertures and the marking being formed at the same time with the holding element remaining in the clamped-position.

23. The method of claim 22 wherein the production apparatus is a machining apparatus and the production process is a machining process.

24. The method for electrical testing of a unit of claim 23, wherein the apertures are configured to permit movement of the electrical contacts therein.

25. The method for electrical testing of a unit of claim 24, wherein the permitted movement is in the vertical direction relative to the apertures.

26. The method for electrical testing of a unit under test according to claim 23, wherein the type of machining process is at least one of laser machining and mechanical machining.

27. The method for electrical testing of a unit under test according to claim 23, further comprising producing the marking as a multiple marking and producing individual markings in the multiple marking using at least one of the a same machining apparatus, a same type of machining and with the holding element being placed in a jig with the marking being made at the same time with the holding element in the jig.

* * * * *